United States Patent
Jun

(10) Patent No.: US 8,021,801 B2
(45) Date of Patent: Sep. 20, 2011

(54) METHOD FOR FABRICATING PHOTOMASK IN SEMICONDUCTOR DEVICE

(75) Inventor: Jea-Young Jun, Cheongju-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 328 days.

(21) Appl. No.: 11/951,209

(22) Filed: Dec. 5, 2007

(65) Prior Publication Data

US 2008/0199786 A1   Aug. 21, 2008

(30) Foreign Application Priority Data

Feb. 21, 2007   (KR) .......................... 10-2007-0017611

(51) Int. Cl.
*G03F 1/00*   (2006.01)
*G03C 5/00*   (2006.01)

(52) U.S. Cl. ............................................... 430/5; 430/30

(58) Field of Classification Search .................. 430/5, 30
See application file for complete search history.

(56) References Cited

U.S. PATENT DOCUMENTS

| | | | | |
|---|---|---|---|---|
| 6,472,107 B1* | 10/2002 | Chan | ................................ | 430/5 |
| 6,562,549 B2* | 5/2003 | Zemen et al. | ................. | 430/316 |
| 7,084,988 B1* | 8/2006 | Rangarajan et al. | .......... | 356/601 |
| 2003/0180631 A1* | 9/2003 | Shiota et al. | ...................... | 430/5 |
| 2005/0019674 A1* | 1/2005 | Okubo et al. | ..................... | 430/5 |
| 2005/0136341 A1 | 6/2005 | Park et al. | | |
| 2006/0121367 A1 | 6/2006 | Misaka | | |

FOREIGN PATENT DOCUMENTS

| KR | 1020030049940 A | 6/2003 |
|---|---|---|
| KR | 1020060133419 A | 12/2006 |

\* cited by examiner

*Primary Examiner* — Mark F Hull
*Assistant Examiner* — Jonathan Jelsma
(74) *Attorney, Agent, or Firm* — Kilpatrick Townsend & Stockton LLP

(57) ABSTRACT

In a method for fabricating a photomask in a semiconductor device, a phase shift layer, a first light blocking layer, an insulating (or intermediate) layer, and a second light blocking layer are deposited on a transparent substrate. A photoresist pattern selectively exposing a surface of the second light blocking layer is formed. A second light blocking pattern exposing a portion of the insulating layer is formed by etching the second light blocking layer using the photoresist pattern as a mask. A critical dimension (CD) of the second light blocking pattern is measured and the CD of the second light blocking pattern is adjusted. A first light blocking pattern and a phase shift pattern are formed by etching the insulating layer, the first light blocking layer, and the phase shift layer using the second light blocking pattern with the adjusted CD as a mask. A photomask pattern having a light blocking region and a transmitting region is formed by removing the second light blocking region and the insulating layer.

11 Claims, 6 Drawing Sheets

METHOD FOR FABRICATING PHOTOMASK IN SEMICONDUCTOR DEVICE

CROSS-REFERENCE TO RELATED APPLICATIONS

The priority to Korean patent application number 10-2007-0017611, filed on Feb. 21, 2007, which is incorporated by reference in its entirety, is claimed.

BACKGROUND OF THE INVENTION

The present invention relates to a semiconductor device, and more particularly, to a method for fabricating a photomask which can correct an error in a critical dimension (CD) of a fine pattern.

In a fabricating process of semiconductor devices, a photolithography process is performed several times to form components on a semiconductor substrate. A photomask with a fine pattern is needed for forming a highly integrated circuit through the photolithography process. In addition, the high integration of semiconductor devices requires a high uniformity in a critical dimension (CD) of a pattern.

A binary mask is generally used as a photomask. The binary mask is fabricated by forming a light blocking layer on a transparent substrate and etching the light blocking layer into a predetermined pattern such that transmitted light penetrates only the substrate and is irradiated on a wafer. However, in order to form a finer pattern, a half-tone phase shift mask has been proposed which can form a finer pattern (as compared with a binary mask) on a wafer by using a phase shift material with transmittance of a few percent.

FIGS. 1A to 1C illustrate cross-sectional views of a conventional photomask.

Referring to FIG. 1A, a phase shift layer 102 and a light blocking layer 104 are sequentially deposited on a transparent substrate 100. A photoresist pattern 106 exposing a portion of the light blocking layer 104 is formed by depositing and patterning a photoresist layer.

Referring to FIG. 1B, a light blocking pattern 108 and a phase shift pattern 110, which define a phase shift region 112 and a light transmitting region 114, are formed by etching the exposed light blocking layer 104 and phase shift layer 102 using the photoresist pattern 106 as a mask so as to selectively expose the transparent substrate 100. The photoresist pattern 106 and the light blocking pattern 108 are removed. Consequently, a phase shift mask pattern 116 including the phase shift region 112 and the light transmitting region 114 is formed on the transparent substrate 100, as illustrated in FIG. 1C.

The phase shift mask pattern 116A is formed by etching a thin layer using the photoresist pattern 106 as an etch mask. In this case, the phase shift mask pattern 116 formed on the transparent substrate 100 may not satisfy a desired condition.

More specifically, referring to FIG. 1C, when the phase shift mask pattern 116 is formed by etching a thin layer using the photoresist pattern 106 as an etch mask, a CD of the phase shift mask pattern 116 formed on the transparent substrate 100 may become smaller than the desired condition, which is indicated by a reference symbol "a", or become larger than the desired condition, which is indicated by a reference symbol "b". When a pattern formed by etching a thin layer cannot satisfy the desired condition, it is difficult to control the CD after the etching process. Therefore, the fabricated photomask may be discarded and a new photomask would need to be fabricated.

SUMMARY OF THE INVENTION

In one embodiment, a method for fabricating a photomask in a semiconductor device includes: depositing a phase shift layer, a first light blocking layer, an insulating (or intermediate) layer, and a second light blocking layer on a transparent substrate; forming a photoresist pattern selectively exposing a surface of the second light blocking layer; forming a second light blocking pattern exposing a portion of the insulating layer by etching the second light blocking layer using the photoresist pattern as a mask; measuring a critical dimension (CD) of the second light blocking pattern and adjusting the CD of the second light blocking pattern; forming a first light blocking pattern and a phase shift pattern by etching the insulating layer, the first light blocking layer, and the phase shift layer using the second light blocking pattern with the adjusted CD as a mask; and forming a photomask pattern having a light blocking region and a transmitting region by removing the second light blocking region and the insulating layer.

The first and second light blocking patterns may include a chrome (Cr) film, and the phase shift layer may include a molybdenum silicon oxynitride (MoSiON) film.

The insulating layer may include a spin on glass (SOG) layer.

The adjusting of the CD of the second light blocking pattern may include: measuring the CD of the second light blocking pattern; and overetching the second light blocking pattern when the measured CD is larger than a desired condition.

The adjusting of the CD of the second light blocking pattern may include: measuring the CD of the second light blocking pattern; and etching the insulating layer under the second light blocking pattern using the second light blocking pattern as an etch mask when the measured CD is smaller than a desired condition.

The insulating layer may be etched to have a slope.

DESCRIPTION OF SPECIFIC EMBODIMENTS

Hereinafter, a method for fabricating a photomask in a semiconductor device in accordance with the present invention will be described in detail with reference to the accompanying drawings.

FIGS. 2 to 8 illustrate a method for fabricating a photomask in a semiconductor device according to one embodiment of the invention.

Figure 1A:
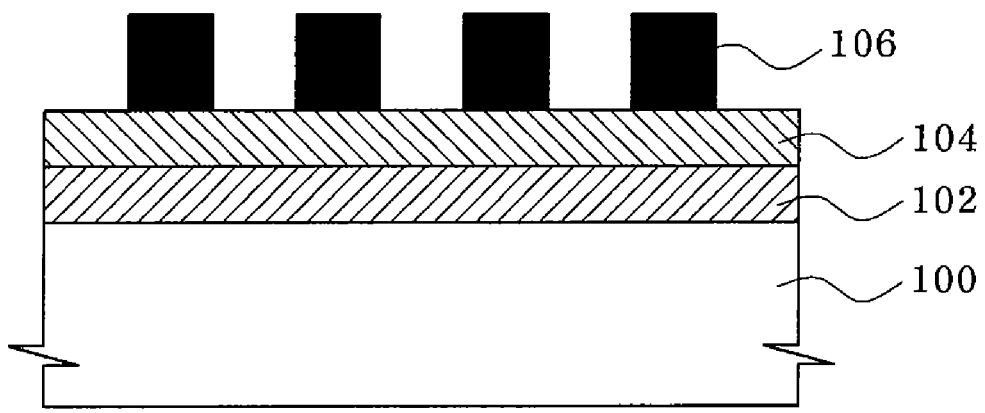
FIGS. 1A to 1C illustrate cross-sectional views of a conventional photomask.
Figure 1B:
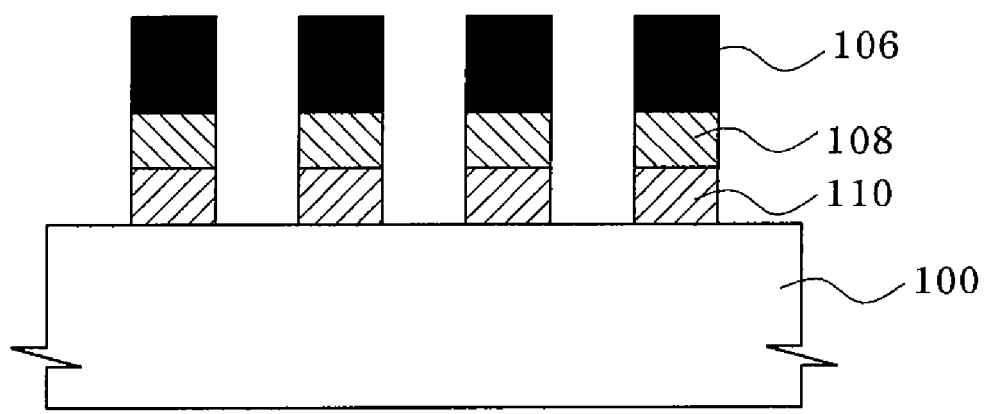
Figure 1C:
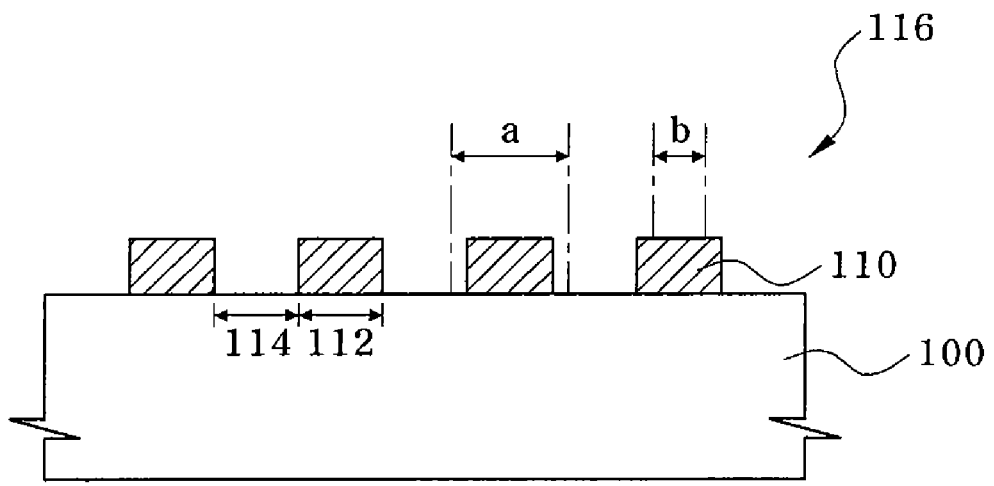
Figure 2:
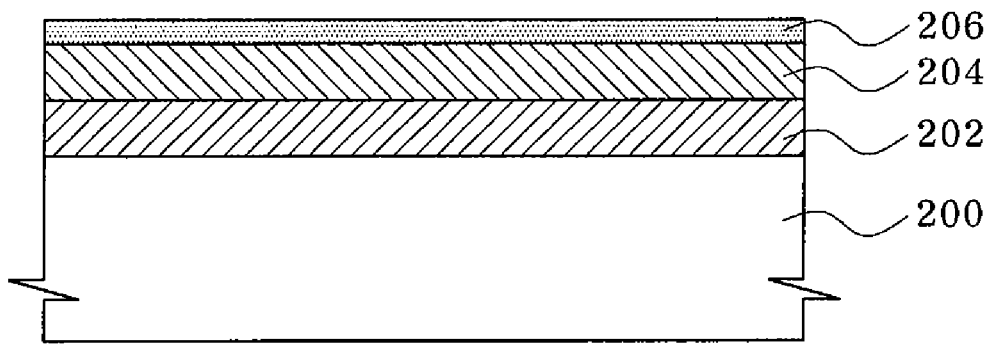
FIGS. 2 to 8 illustrate a method for fabricating a photomask in a semiconductor device according to one embodiment of the invention.

Referring to FIG. 2, a phase shift layer 202 and a first light blocking layer 204 are deposited on a transparent substrate 200. The transparent substrate 200 is formed of a transparent material such as quartz. The phase shift layer 202 deposited on the transparent substrate 200 includes a material capable of shifting a phase of light in an exposure process, for example, a molybdenum silicon oxynitride (MoSiON) film. The first light blocking layer 204 deposited on the phase shift layer 202 may include a chrome (Cr) film.

An insulating (or intermediate) layer 206 is formed on the first light blocking layer 204. The insulating layer 206 serves to correct a CD of a mask pattern. The insulating layer 206 may be formed of a fluent substance and may be formed to a thickness of approximately 200 Å to approximately 500 Å by applying a spin on glass (SOG) layer. The thickness of the insulating layer 206 may be controlled depending on kinds of a mask to be fabricated, for example, an ArF mask or a KrF mask.

Figure 3:
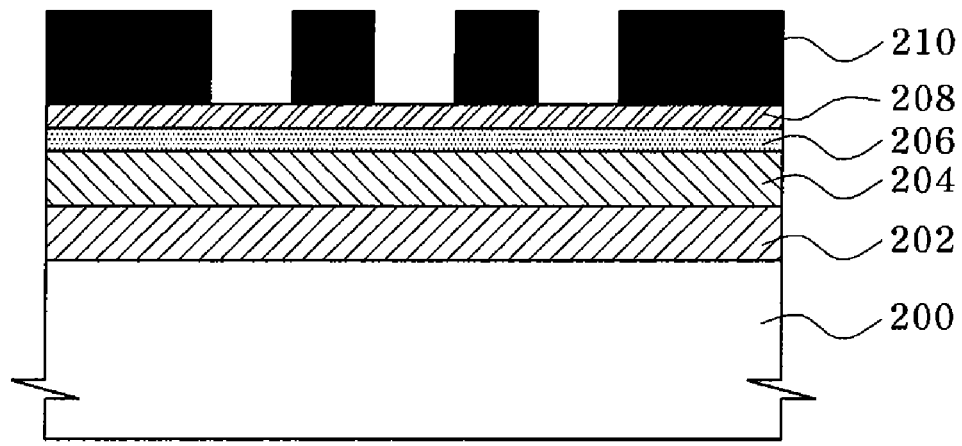

Referring to FIG. 3, a second light blocking layer 208 is deposited on the insulating layer 206 and a photoresist layer is formed on the second light blocking layer 208. A photoresist pattern 210, which defines a mask pattern forming region, is formed by performing exposure and development processes using an E-beam on the photoresist layer. The second light blocking layer 208 may be formed of a material similar to the first light blocking layer 204, for example, a chrome (Cr) layer to a thickness of approximately 200 Å to approximately 500 Å. The thickness of the second light blocking layer 208 may vary depending on the type of mask to be fabricated, for example, an ArF mask or a KrF mask.

Figure 4:
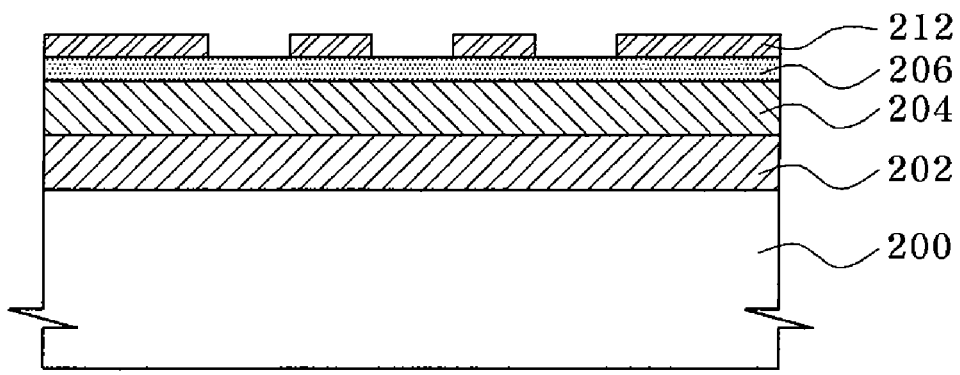

Referring to FIG. 4, a second light blocking pattern 212 is formed by etching the exposed second light blocking layer 208 of FIG. 3 using the photoresist pattern 210 as a mask. The photoresist pattern 210 is removed through a strip process. A CD of the second light blocking pattern 212 is measured using a CD measuring apparatus.

When the measured CD of the second light blocking pattern 212 is larger or smaller than a desired condition, the CD may be corrected to the desired condition using the insulating layer 206 under the second light blocking pattern 212. This will now be described with reference to FIGS. 5A to 8.

Figure 5A:
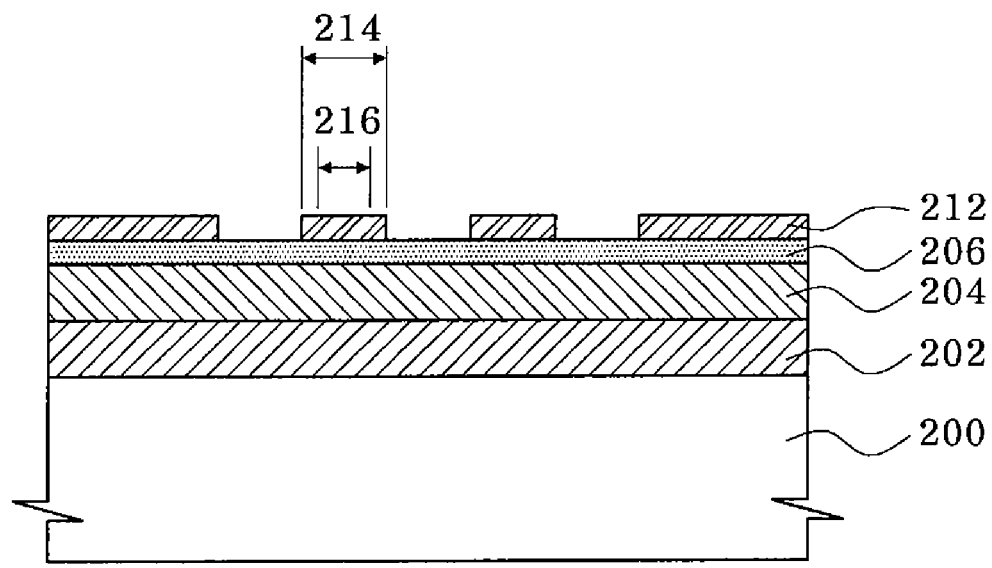
Figure 5B:
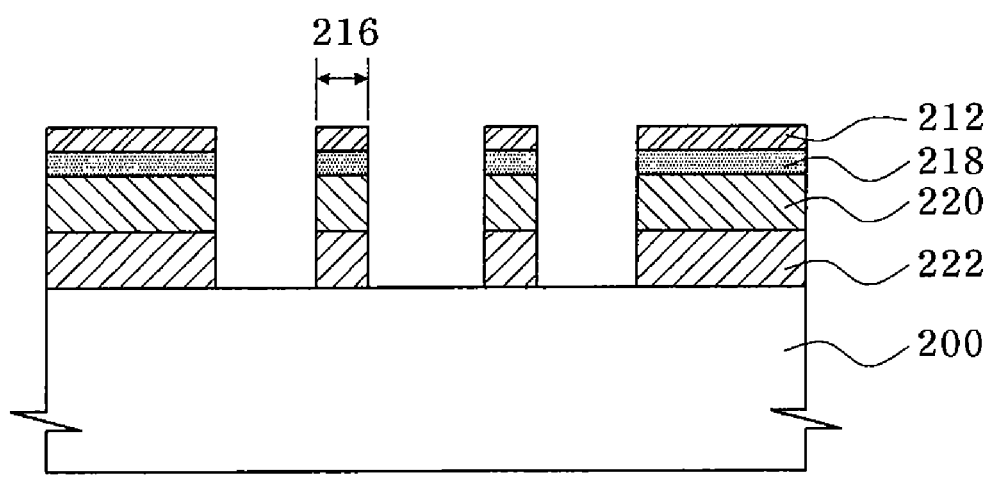

Referring to FIG. 5A, when a CD 214 of the second light blocking pattern 212 is larger than a desired CD 216, the CD 214 of the second light blocking pattern 212 is corrected to the CD 216 of the desired condition by performing an overetch process on the second light blocking pattern 212, as illustrated in FIG. 5B. An insulating pattern 218 is formed by etching the insulating layer 206 using the second light blocking pattern 212 with the corrected CD as a mask. A first light blocking pattern 220 and a phase shift pattern 222 are formed by etching the first light blocking layer 204 and the phase shift layer 202 using the second light blocking pattern 212 and the insulating pattern 218 as a mask. The second light blocking pattern 212 and the insulating pattern 218 are etched during an overetch process and may be removed during a subsequent process.

Figure 6:
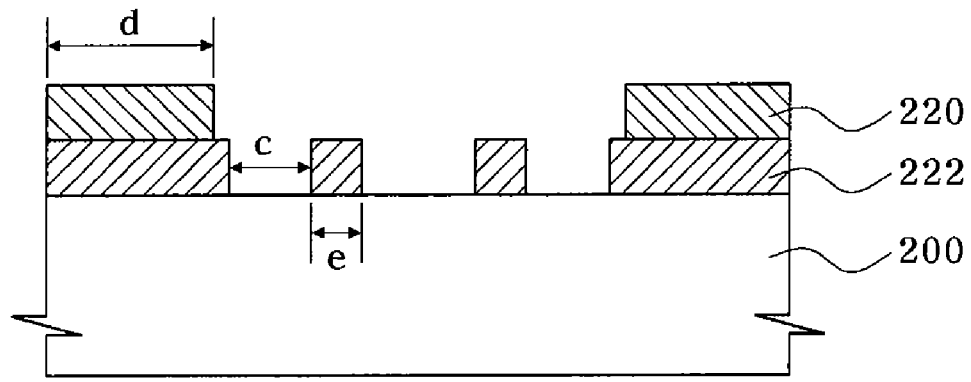

Referring to FIG. 6, a photomask including a transmitting region c, a light blocking region d, and a phase shift region e is formed by selectively removing the second light blocking pattern 212 with the corrected CD and the insulating pattern 218.

Figure 7A:
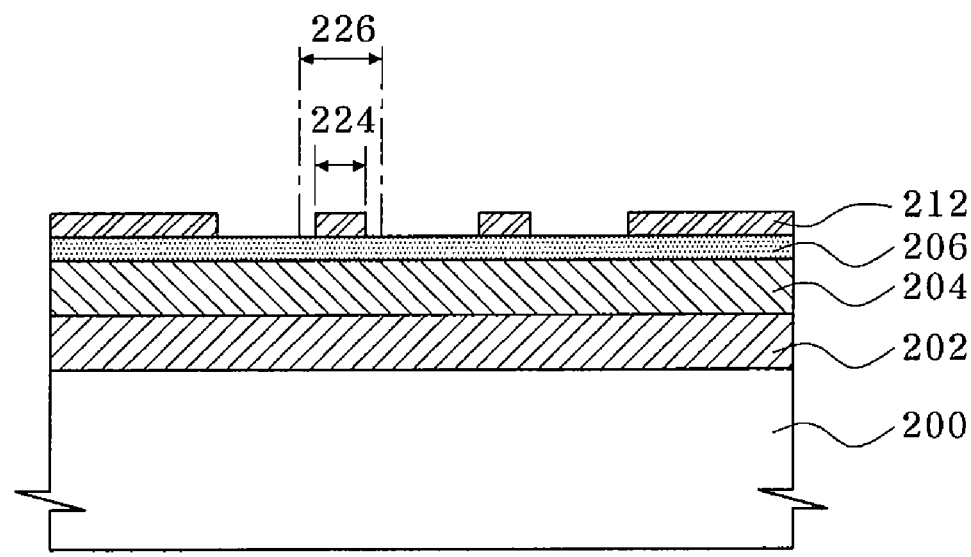
Figure 7B:
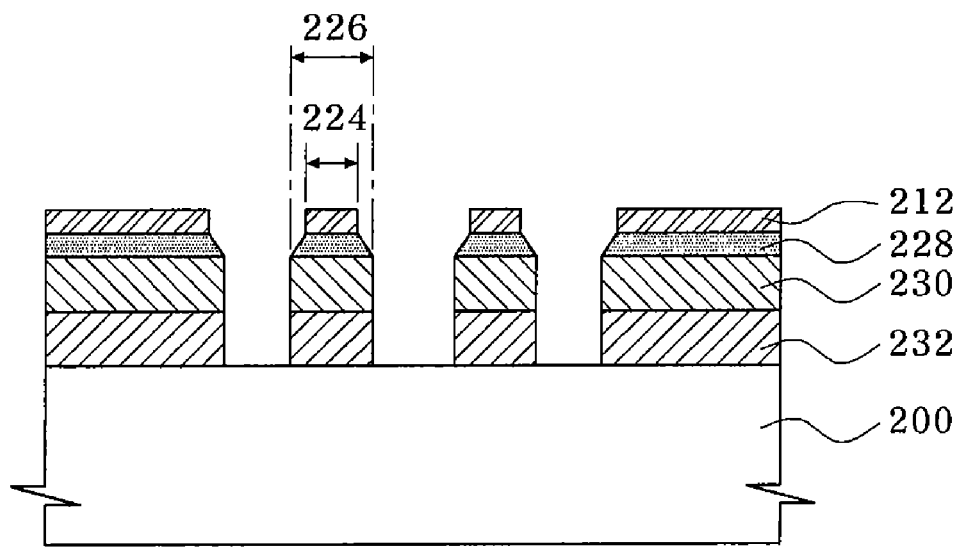

Referring to FIG. 7A, when a CD 224 of the second light blocking pattern 212 is smaller than a CD 226 of desired condition, an insulating pattern 228 is formed by performing a slope etch process on the insulating layer 206 under the second light blocking pattern 212 using the second light blocking pattern 212 as a mask, as illustrated in FIG. 7B. The CD 224 of the second light blocking pattern 212 smaller than the CD 226 of desired condition can be corrected by forming the insulating pattern 228 using the slope etch process. A first light blocking pattern 230 and a phase shift pattern 232 are formed by etching the first light blocking layer 204 and the phase shift layer 202 using the second light blocking pattern 212 and the insulating pattern 228 as a mask. The second light blocking pattern 212 and the insulating pattern 228 are etched during the slope etch process and are removed during a subsequent process.

Figure 8:
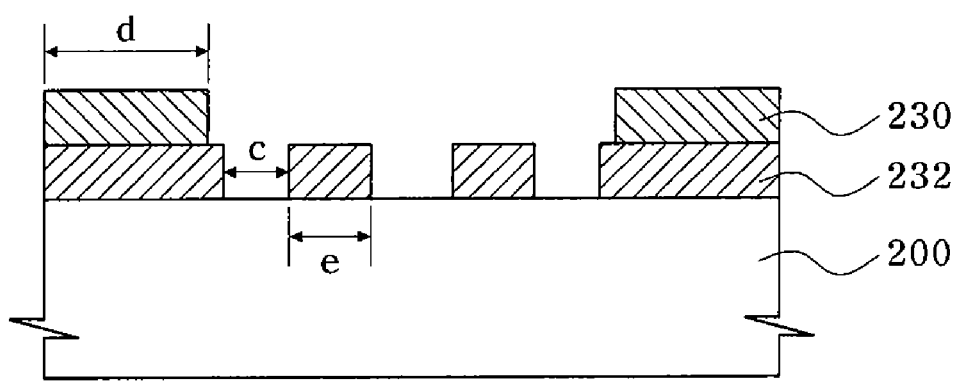

Referring to FIG. 8, a photomask including a transmitting region c, a light blocking region d, and a phase shift region e is formed by selectively removing the second light blocking pattern 212 with the corrected CD and the insulating pattern 228.

According to a method for fabricating a photomask in a semiconductor device, a double layer is deposited on a phase shift layer and a light blocking layer, and a critical dimension (CD) of a pattern is measured. The CD can be corrected to a CD of a desired condition by adjusting the double layer depending on the measured results. A fine pattern on a photomask can be formed and corrected without damaging the lower layers by using the double layer, thereby reducing the scraping of a mask due to a CD that cannot satisfy a desired condition.

While the invention has been described with respect to the specific embodiments, it will be apparent to those skilled in the art that various changes and modifications may be made without departing from the spirit and scope of the invention as defined in the following claims.

What is claimed is:

1. A method for fabricating a photomask, the method comprising:
    forming a phase shift layer, a first chrome layer, an intermediate layer, and a second chrome layer sequentially over a transparent substrate, wherein a thickness of the second chrome layer is thinner than the first chrome layer;
    forming a photoresist pattern directly on the second chrome layer;
    etching the second chrome layer to form a second chrome pattern exposing a portion of the intermediate layer by using the photoresist pattern as an etching mask, the second chrome pattern defining a first dimension;
    measuring a critical dimension (CD) of the second chrome pattern;
    overetching the second chrome pattern when the measured CD is larger than a desired condition;
    forming an intermediate pattern having a second dimension by using the overetched second chrome pattern as an etch mask, wherein the second dimension is defined the desired condition;
    etching the first chrome layer and the phase shift layer using the overetched second chrome pattern and the intermediate pattern to form a first chrome pattern and a phase shift pattern, the phase shift pattern having the second dimension; and
    removing the second chrome pattern and the intermediate pattern to form a photomask having a light blocking region, a transmitting region, and a phase shift region.

2. The method of claim 1, wherein the intermediate pattern, the first chrome pattern, and the phase shift pattern all define the second dimension and the method further comprises:
    removing the second chrome pattern and the intermediate pattern overlying the phase shift region.

3. The method of claim 1, wherein the phase shift region defines a critical dimension that is substantially the same as the second dimension.

4. The method of claim 1, wherein the phase shift layer comprises a molybdenum silicon oxynitride (MoSiON) film.

5. The method of claim 1, wherein the intermediate layer is a spin-on-glass (SOG) layer.

6. The method of claim 1, wherein the intermediate layer is etched using the second chrome pattern so that the intermediate layer is provided with a substantially vertical profile.

7. The method of claim 1, wherein the second chrome pattern is formed to a thickness of approximately 200 angstroms to approximately 500 angstroms.

8. A method for fabricating a photomask, the method comprising:

forming a phase shift layer, a first chrome layer, an intermediate layer, and a second chrome layer sequentially over a transparent substrate, wherein a thickness of the second chrome layer is thinner than the first chrome layer;

forming a photoresist pattern directly on the second chrome layer;

etching the second chrome layer to form a second chrome pattern exposing a portion of the intermediate layer by using the photoresist pattern as an etching mask, the second chrome pattern defining a first dimension;

measuring a critical dimension (CD) of the second chrome pattern;

etching the intermediate pattern to form a intermediate pattern having a slope profile by using the second chrome pattern when the measured CD is smaller than a desired condition, wherein a width of bottom surface of the intermediate pattern has a second dimension, the second dimension is defined the desired condition;

etching the first chrome layer and the phase shift layer using the second chrome pattern and the intermediate pattern having a slope profile to form a first chrome pattern and a phase shift pattern, the phase shift pattern having the second dimension; and removing the second chrome pattern and the intermediate pattern to form a photomask having a light blocking region, a transmitting region, and a phase shift region.

9. The method of claim 8, wherein the intermediate layer is etched using the second chrome pattern so that the intermediate layer is provided with a slope.

10. The method of claim 8, wherein the intermediate layer is a spin-on-glass (SOG) layer.

11. The method of claim 8, wherein the second chrome pattern is formed to a thickness of approximately 200 angstroms to approximately 500 angstroms.

* * * * *